United States Patent
Gibson et al.

(10) Patent No.: US 8,131,490 B2
(45) Date of Patent: Mar. 6, 2012

(54) METHODS AND SYSTEMS FOR DETERMINING A RECEIVED SIGNAL FREQUENCY

(75) Inventors: Timothy P. Gibson, Overland Park, KS (US); Jeffrey Kent Hunter, Olathe, KS (US)

(73) Assignee: Honeywell International Inc., Morristown, NJ (US)

( * ) Notice: Subject to any disclaimer, the term of this patent is extended or adjusted under 35 U.S.C. 154(b) by 430 days.

(21) Appl. No.: 11/961,653

(22) Filed: Dec. 20, 2007

(65) Prior Publication Data

US 2009/0164160 A1    Jun. 25, 2009

(51) Int. Cl.
*G01R 23/00* (2006.01)
*G06F 11/00* (2006.01)

(52) U.S. Cl. .......... 702/75; 702/121; 702/189; 702/190; 324/76.39; 324/76.42; 324/76.44

(58) Field of Classification Search .............. 702/75–79, 702/106, 107, 121–126, 189–195
See application file for complete search history.

(56) References Cited

U.S. PATENT DOCUMENTS

| | | | |
|---|---|---|---|
| 4,893,266 A * | 1/1990 | Deem | 708/405 |
| 5,099,194 A | 3/1992 | Sanderson et al. | |
| 5,099,243 A | 3/1992 | Tsui et al. | |
| 5,109,188 A * | 4/1992 | Sanderson et al. | 324/76.35 |
| 5,198,748 A | 3/1993 | Tsui et al. | |
| 5,227,987 A | 7/1993 | Imazawa | |
| 5,781,156 A | 7/1998 | Krasner | |
| 5,815,101 A * | 9/1998 | Fonte | 341/123 |
| 6,026,418 A | 2/2000 | Duncan, Jr. | |
| 6,031,869 A | 2/2000 | Priebe et al. | |
| 6,301,545 B1 | 10/2001 | Brodie | |
| 6,337,885 B1 | 1/2002 | Hellberg | |
| 7,171,175 B2 | 1/2007 | Lahti et al. | |
| 7,498,966 B2 | 3/2009 | Hunter et al. | |

(Continued)

FOREIGN PATENT DOCUMENTS

GB    2062395    5/1981

(Continued)

OTHER PUBLICATIONS

Bostaman et al., "Experimental Investigation of Undersampling for Adjacent Channel Interference Cancellation Scheme", "IEEE 16th Symposium on Personal, Indoor and Mobile Radio Communications", 2005, pp. 2606-2610, Publisher: IEEE.

(Continued)

*Primary Examiner* — Phuong Huynh
(74) *Attorney, Agent, or Firm* — Fogg & Powers LLC

(57) ABSTRACT

A system and method for determining a received signal frequency by sampling the received signal at a rate less than twice a predefined nyquist rate. The system includes a distorting component configured to distort the received signal in a frequency dependent manner, at least one analog to digital converter configured to sample the received signal and the distorted signal at a rate less than twice a predefined nyquist rate, and a processing component configured to determine a frequency of the received signal based on the sampled received signal and the sampled distorted signal. The method includes distorting the received signal, sampling the received signal and the distorted signal at a rate less than twice a predefined nyquist rate, and determining a frequency of the received signal. In an embodiment, distorting includes at least one of distorting an amplitude or a group delay of the received signal.

15 Claims, 4 Drawing Sheets

U.S. PATENT DOCUMENTS

2006/0227898 A1  10/2006  Gibson et al.
2006/0239389 A1* 10/2006  Coumou ..................... 375/346
2007/0086544 A1   4/2007  Fudge et al.

FOREIGN PATENT DOCUMENTS

GB            2349783       11/2000

OTHER PUBLICATIONS

Bartley, "The Practicality of Processing Undersampled Waveforms", Apr. 18, 1981, pp. 199-200.

European Patent Office, "European Search Report", Apr. 29, 2009, Published in: EP.

* cited by examiner

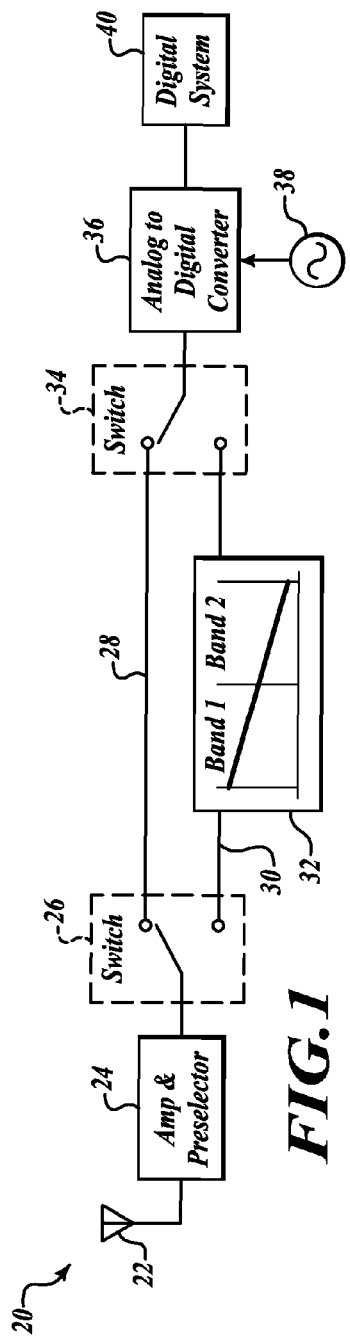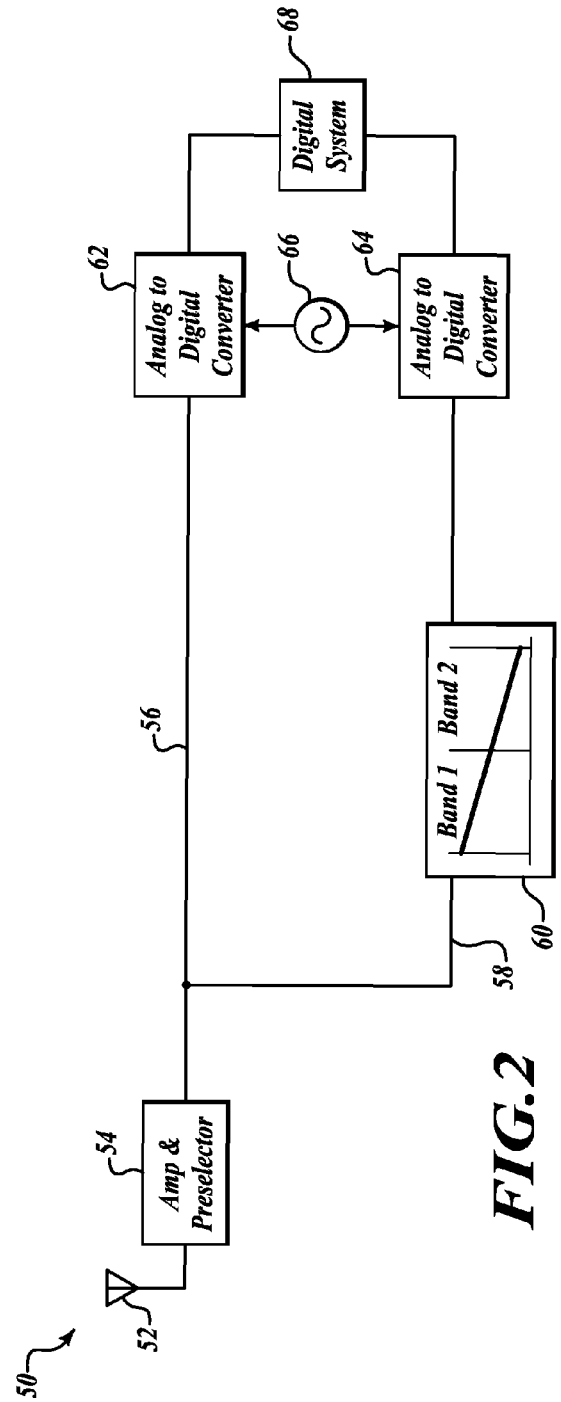

METHODS AND SYSTEMS FOR DETERMINING A RECEIVED SIGNAL FREQUENCY

BACKGROUND OF THE INVENTION

Analog to digital converters (ADCs) do not have adequate performance to simultaneously sample the entire frequency band used by distance measuring equipment (DME) and some other radio frequency (RF) reception systems. These limitations result in difficulties distinguishing desired signals from other signals and difficulties distinguishing aliases of desired signals from other signals. Generally, if a nyquist rate is defined as being not less than the highest received signal frequency, sampling a signal below two times the nyquist rate results in signal aliasing, where the alias frequency is given by the absolute value of the closest integer multiple of the sampling frequency minus the input signal frequency. Signal aliases tend to be indistinguishable from other non-aliased signals having the same frequency.

SUMMARY OF THE INVENTION

The present invention includes a system for determining a received signal frequency by sampling the received signal at a rate less than twice a predefined nyquist rate. The system includes a distorting component configured to distort the received signal in a frequency dependent manner, at least one analog to digital converter (ADC) configured to sample the received signal and the distorted signal at a rate less than twice a predefined nyquist rate, and a processing component configured to determine a frequency of the received signal based on the sampled received signal and the sampled distorted signal. Generally, the predefined nyquist rate is not less than the highest received signal frequency, and results in a sampling rate of not less than two times the highest received signal frequency. In an example embodiment, the at least one ADC samples at a rate less than two times the highest received signal frequency.

In accordance with further aspects of the invention, the distorting component is configured to distort at least one of an amplitude or a group delay of the received signal.

In accordance with other aspects of the invention, the system includes an amplifier for amplifying the received signal before the signal is passed as an amplified received signal to the distorting component. In some embodiments, the system also includes a first switch for switching the amplified received signal to a normal receive path or to an input of the distorting component, and a second switch for switching either the amplified received signal from the normal receive path or an output of the distorting component to an input of the at least one ADC.

In accordance with still further aspects of the invention, the invention includes a method for determining a received signal frequency by sampling the received signal at a rate less than twice a predefined nyquist rate. The method includes amplifying the received signal, distorting the amplified signal, sampling the amplified signal and the distorted signal at a rate less than twice a predefined nyquist rate, and determining a frequency of the received signal.

In accordance with yet other aspects of the invention, distorting includes at least one of distorting an amplitude or a group delay of the amplified received signal.

In accordance with further aspects of the invention, distorting includes distorting the amplified received signal such that higher frequencies are distorted to a greater extent of distortion than lower frequencies with the extent of distortion imposed increasing monotonically with relationship to frequency.

In accordance with additional aspects of the invention, distorting includes distorting the amplified received signal such that a first previously identified frequency band is distorted to a greater extent of distortion than a second previously identified frequency band.

In accordance with still other aspects of the invention, the extent of distortion is imposed on the first frequency band and the second frequency band in a non-monotonic fashion.

As will be readily appreciated from the foregoing summary, the invention provides a system and method for determining a received signal frequency by sampling the received signal at a rate less than twice a predefined nyquist rate.

BRIEF DESCRIPTION OF THE DRAWINGS

Preferred and alternative embodiments of the present invention are described in detail below with reference to the following drawings:

FIG. 1 is a block diagram of a system formed in accordance with an example embodiment of the invention that includes a single ADC;

FIG. 2 is a block diagram of a system formed in accordance with an embodiment of the invention that includes multiple ADCs;

DETAILED DESCRIPTION OF THE PREFERRED EMBODIMENT

Figure 3:
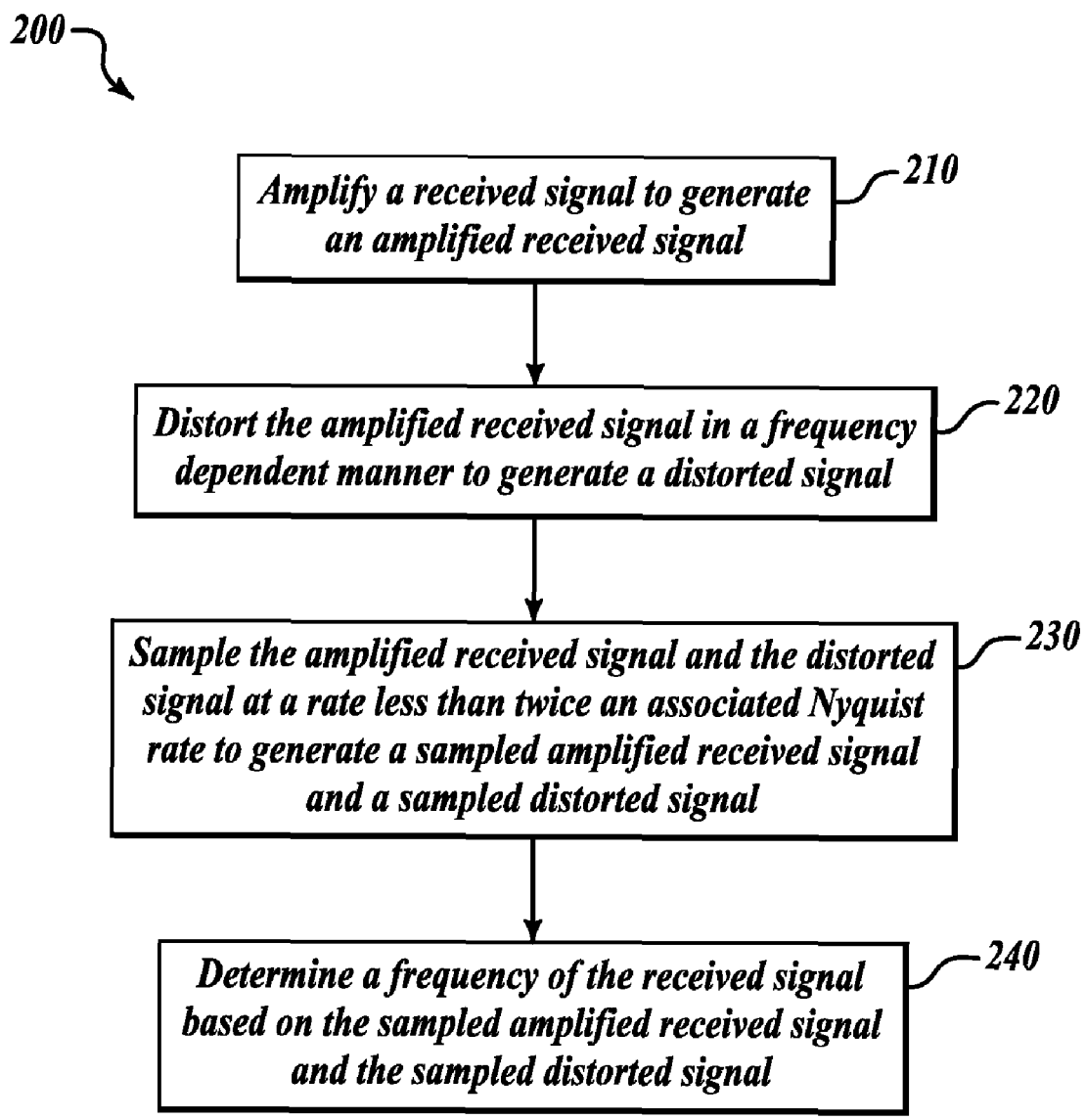
FIG. 3 is a flowchart of a method of determining a frequency of a received signal in accordance with an example of the invention.

FIG. 1 is a block diagram of a system 20 formed in accordance with an example embodiment of the invention. The system 20 includes an antenna 22 connected to an input of an amplifier and preselector component 24. Although the antenna 22 and the amplifier and preselector component 24 are shown in this example, other examples may use different radio frequency (RF) front ends. There may be several stages of mixing, filtering, and amplification rather than the single antenna 22 and component 24, for example. In still other examples, the system 20 may not be a wireless system using an antenna, but could be used for communication over coaxial cable or any other kind of wire or fiber optic cable with time varying signals to process.

Still referring to FIG. 1, an output of the amplifier and preselector 24 is connected to an input of a first switch 26. The first switch 26 is operable to connect the input to a first path 28 or a second path 30. The second path 30 is in signal communication with an input of a distorting component 32. The distorting component 32 may be configured to distort an amplitude of a signal in a frequency-dependent manner, for example. Distorting the amplitude may include amplifying or attenuating the signal. The first path 28 is in signal communication with a first input of a second switch 34.

An output of the distorting component 32 is in signal communication with a second input of the second switch 34. An output of the second switch 34 is connected to an input of an ADC 36. A sample rate of the ADC 36 is driven by an oscillator 38. An output of the ADC 36 serves as an input to a digital system 40. Although the first switch 26 and the second switch 34 are described as having inputs and outputs, it should be understood that the switches 26, 34 are simply switching signals between alternate paths. The switches 26, 34 may be mechanical switches, electro-mechanical switches, or solid-state electronic switches. The switches 26, 34 may be single pole double throw (SPDT) or single pole changeover switches (SPCO), for example. Alternatively, in some embodiments, both of the switches 26, 34 could be implemented using one double pole double throw (DPDT) switch or one double pole changeover (DPCO) switch, for example.

Still referring to FIG. 1, the system 20 receives an RF signal at the antenna 22, amplifies the received signal with the amplifier and preselector 24, and switches the amplified signal with the first switch 26 to either the distorting component 32 or the second switch 34. In some embodiments, the amplifier and preselector 24 also preselects a predetermined frequency band, such as by using a filter for example. In an example, the switches 26, 34 are synchronized such that the ADC 36 receives either a non-distorted signal via the first path 28 or a distorted signal that has passed through the distorting component 32. The digital system 40 receives output from the ADC 36, tracks whether the output corresponds to the distorted or non-distorted path, and processes the output to determine a frequency of the signal received by the antenna 22. In some embodiments, the digital system 40 also controls the switches 26, 34 at a first predetermined switching rate and a second predetermined switching rate respectively. The switching rates are determined by system requirements for channel identification time, frequency resolution, interferer identification time, and/or other parameters.

In an example embodiment, the system 20 is included as part of a distance measuring equipment (DME) system. Generally, an aircraft's DME transponder transmits using frequencies from 1025 to 1150 MHz and receives on a corresponding channel between 962 and 1213 MHz. Additionally, DME facilities use a 1350 Hz identification frequency. In some examples, the system 20 is configured to identify DME response signals in the 962 to 1213 MHz range received at an aircraft. The system 20 may also be used in other types of RF systems having different frequency ranges in other embodiments.

FIG. 2 is a block diagram of a system 50 formed in accordance with an example embodiment of the invention. The system 50 includes an antenna 52 connected to an input of an amplifier and preselector component 54. An output of the amplifier and preselector 54 is in signal communication with a first path 56 and a second path 58. The second path 58 is in signal communication with an input of a distorting component 60. The distorting component 60 may be configured to distort an amplitude of a signal in a frequency-dependent manner or delay a group of signals in a frequency-dependent manner, for example. The first path 56 is in signal communication with an input of a first ADC 62. An output of the distorting component 60 is in signal communication with an input of a second ADC 64. A sample rate of the first ADC 62 and the second ADC 64 is driven by an oscillator 66. An output of the first ADC 62 and an output of the second ADC 64 are in signal communication with a digital system 68.

Still referring to FIG. 2, the system 50 receives an RF signal at the antenna 52, amplifies the received signal with the amplifier and preselector 54, and routes the amplified signal to both an input of the distorting component 60 and to the first ADC 62. In some embodiments, the amplifier and preselector 54 also preselects a predetermined frequency band, such as by using a filter, for example. The distorting component 60 distorts the amplified signal in a frequency-dependent manner such that a portion of the amplified signal in a first frequency band is distorted in a different manner from a portion of the amplified signal in a second frequency band. The second ADC 64 then samples the distorted signal from the distorting component 60. The digital system 68 receives output from both the first ADC 62 and the second ADC 64 and processes the output to determine a frequency of the signal received by the antenna 52. In an example embodiment, the system 50 is included as part of a DME system.

In some embodiments, referring to FIGS. 1 and 2, the distorting component 32 or 60 is configured to distort in a manner such that higher frequencies are distorted to a greater extent of distortion than lower frequencies. In an example, the extent of distortion is imposed in a monotonically increasing relationship to frequency. In other embodiments, the distorting component may be configured to distort in a manner such that lower frequencies are distorted to a greater extent of distortion than higher frequencies. In still other embodiments, the distorting component is configured to distort in a manner such that a first previously identified frequency band is distorted to a greater extent of distortion than a second previously identified frequency band. In an example, the extent of distortion is imposed on the first frequency band and the second frequency band in a non-monotonic fashion. In some embodiments, signals within the first frequency band may be distorted to a first approximately constant extent of distortion and signals within the second frequency band may be distorted to a second approximately constant extent of distortion that is different than the first extent of distortion.

FIG. 3 is a flowchart of a method 200 of determining a frequency of a received signal in accordance with an example of the invention. First, at a block 210, a received signal is amplified to generate an amplified received signal, such as by using an amplifier and preselector component such as the component 24 or 54, for example. Then, at a block 220, the amplified received signal is distorted in a frequency dependent manner to generate a distorted signal, such as by using a distorting component such as the component 32 or 60, for example. Then, at a block 230, the amplified received signal and the distorted signal are sampled at a rate less than twice a predefined nyquist rate and converted to a digital non-distorted signal and a digital distorted signal respectively, such as by using one or more ADCs. Then, at a block 240, a frequency of the received signal is determined based on the digital non-distorted signal and the digital distorted signal, such as by using a digital system such as the digital system 40 or 68, for example. The digital system may use either an equation or a look-up-table based on the frequency of the received signal, and compare the signal characteristic through each of the two paths to see what true frequency is associated with the measured change in signal characteristics.

Figure 4:
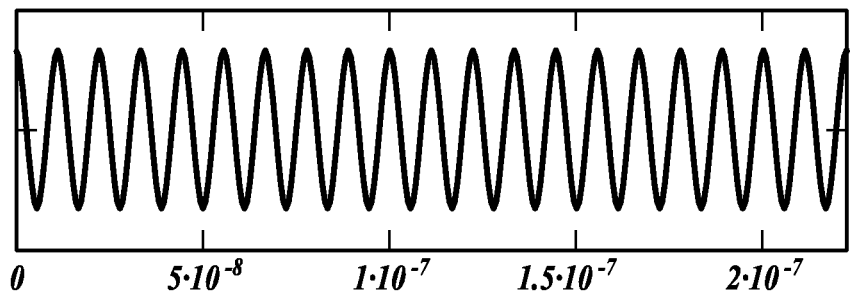
FIGS. 4-7 illustrate example signals for an embodiment that uses amplitude variation in a distorting system.
Figure 5:
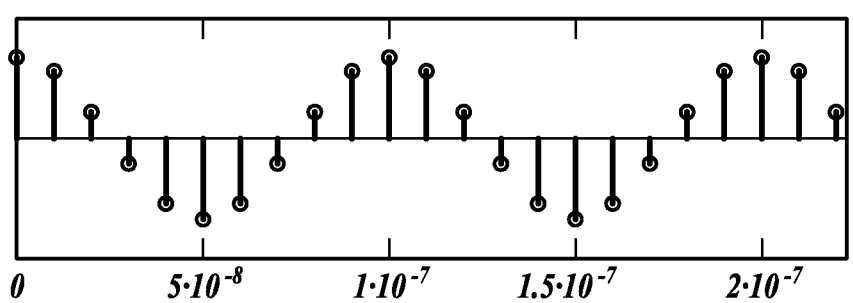

FIGS. 4-7 illustrate example signals for an embodiment that uses amplitude variation in the distorting system. FIG. 4 shows a 90 MHz signal such as would be received at the ADC 36 or the ADC 62 after passing through a normal non-distorting path, such as the first path 28 or 56 respectively. FIG. 5 shows how the signal shown in FIG. 4 would appear when sampled/digitized at 100 mega samples per second (MSPS). By looking at only FIG. 5, it cannot be told whether the signal is a 10 MHz signal or an aliased 90 MHz signal. In this example, the distorting system, such as the distorting system 32 or 60, has 0 dB of attenuation at 10 MHz, but has 6 dB of attenuation at 90 MHz.

Figure 6:
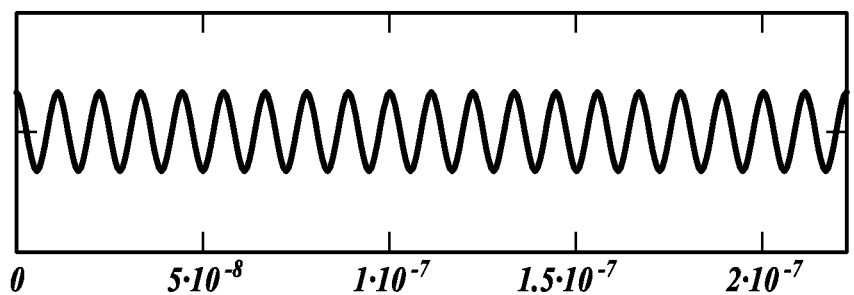
Figure 7:
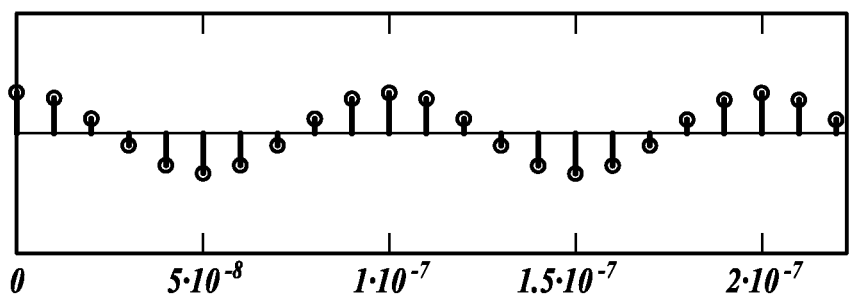

FIG. 6 shows the 90 MHz signal after it is passed through a distorting path, such as through the distorting component 32 or the distorting component 60. FIG. 7 shows how the signal shown in FIG. 6 would appear when sampled/digitized at 100 MSPS. Although units for amplitude are not shown, the amplitude scale in FIGS. 4-7 is the same in each figure. In this example, a digital system, such as the digital system 40 or the digital system 68, compares the sampled signals shown in FIGS. 5 and 7. The digital system then identifies the signal as being an alias of 90 MHz based on the amplitude variation between the sampled signal from the non-distorting path and the sampled signal from the distorted path. If the signal had been a 10 MHz signal rather than an aliased 90 MHz signal, the amplitudes of the compared sampled signals would have been approximately the same.

Figure 8:
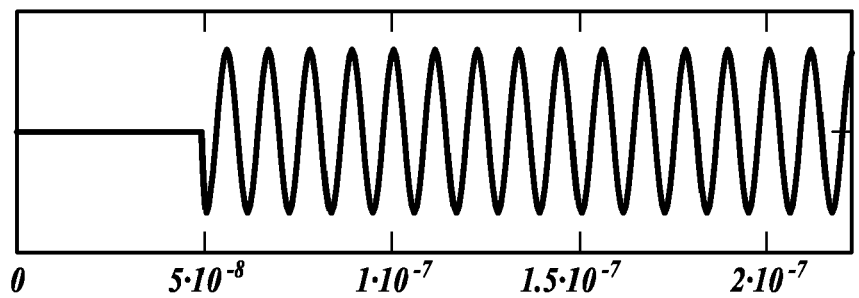
FIGS. 8-11 illustrate example signals for an embodiment that uses group delay variation in a distorting system.
Figure 9:
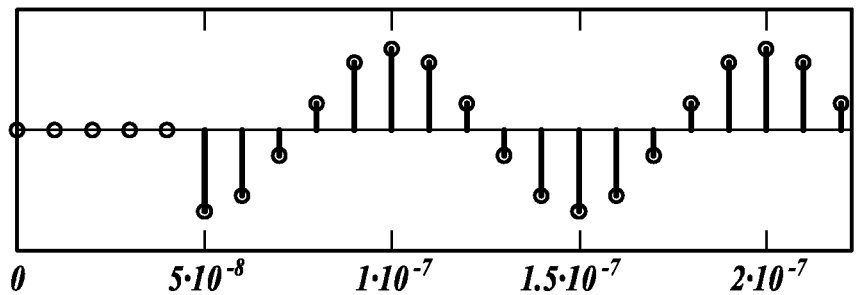
Figure 10:
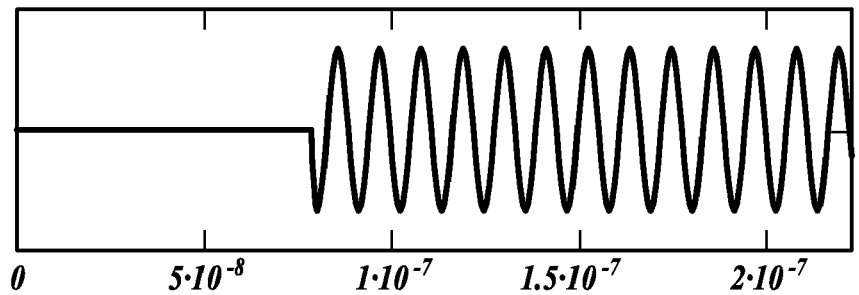
Figure 11:
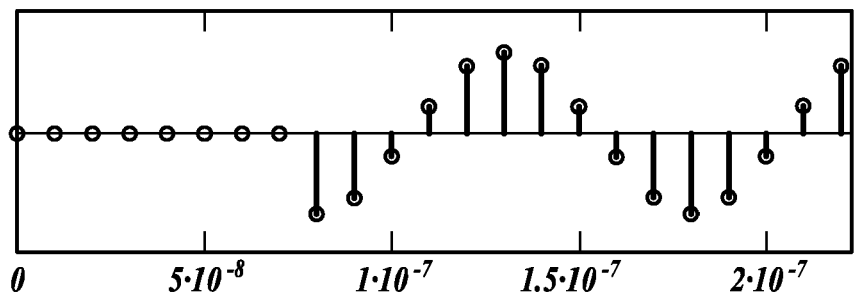

FIGS. 8-11 illustrate example signals for an embodiment that uses group delay variation in the distorting system. FIG. 8 shows a 90 MHz signal such as would be received at the ADC 62 after passing through a normal non-distorting path, such as the first path 56. FIG. 9 shows how the signal shown in FIG. 8 would appear when sampled at 100 MSPS. By looking at only FIGS. 8 and 9, it cannot be told whether the signal is a 10 MHz signal or an aliased 90 MHz signal. In this example, the distorting system, such as the distorting system 60, does not cause a signal group delay at 10 MHz, but causes a signal group delay at 90 MHz. FIG. 10 shows the 90 MHz signal after it is passed through a distorting path, such as through the distorting component 60. It can be seen that the signal in FIG. 10 is delayed as compared to the signal in FIG. 8. FIG. 11 shows how the signal shown in FIG. 10 would appear when sampled at 100 MSPS. In this example, a digital system, such as the digital system 68 compares the sampled signals shown in FIGS. 9 and 11. The digital system then identifies the signal as being an alias of 90 MHz based on the group delay variation between the sampled signal from the non-distorting path and the sampled signal from the distorted path. If the signal had been a 10 MHz signal rather than an aliased 90 MHz signal, the group delays of the compared sampled signals would have been approximately the same.

While the preferred embodiment of the invention has been illustrated and described, as noted above, many changes can be made without departing from the spirit and scope of the invention. For example, in some embodiments, the amplifier and preselector 24 and/or the amplifier and preselector 54 may only amplify a received signal rather than both amplifying and preselecting a particular frequency band. Additionally, there may be many stages of amplification, filtering, and mixing before the signal is applied to the distorting and non-distorting paths. Additionally, the distorting components 32, 60 may be configured to distort signals in other manners, such as by distorting both amplitude and group delay, for example. The system may also be configured to conduct additional processing, such as fourier analysis by using a fast fourier transform (FFT), for example. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A system for determining a received signal frequency by sampling the received signal at a rate less than twice a predefined nyquist frequency, the system comprising:
    a distorting component configured to distort an amplitude of the received signal in a frequency dependent manner to generate a distorted signal;
    an analog to digital converter (ADC) configured to sample the received signal and the distorted signal at a rate less than twice a predefined nyquist frequency to generate a sampled received signal and a sampled distorted signal; and
    a processing component configured to determine a frequency of the received signal based on the sampled received signal and the sampled distorted signal.

2. The system of claim 1, further comprising:
    a first switch for switching the received signal to a normal receive path or to an input of the distorting component at a first predefined switching rate; and
    a second switch for switching either the received signal from the normal receive path or an output of the distorting component to an input of the at least one ADC at a second predefined switching rate.

3. The system of claim 1, wherein the distorting component is configured to distort the received signal such that higher frequencies are distorted to a greater extent of distortion than lower frequencies with the extent of distortion imposed in a monotonically increasing relationship to frequency.

4. The system of claim 1, wherein the distorting component is configured to distort the received signal such that lower frequencies are distorted to a greater extent of distortion than higher frequencies.

5. The system of claim 1, wherein the distorting component is configured to distort the received signal such that a first previously identified frequency band is distorted to a greater extent of distortion than a second previously identified frequency band.

6. The system of claim 5, wherein the extent of distortion is imposed on the first frequency band and the second frequency band in a non-monotonic fashion.

7. The system of claim 1, further comprising:
    wherein the system is a distance measuring equipment (DME) system; and
    wherein the received signal is a a received DME signal.

8. A method for determining a received signal frequency by sampling the received signal at a rate less than twice a predefined nyquist frequency, the method comprising:
    distorting an amplitude of the received signal in a frequency dependent manner to generate a distorted signal;
    sampling the received signal and the distorted signal at a rate less than twice a predefined nyquist frequency using at least one sampling means to generate a sampled received signal and a sampled distorted signal; and
    determining, using a processor, a frequency of the received signal based on the sampled received signal and the sampled distorted signal.

9. The method of claim 8, further comprising:
    switching the received signal to a normal receive path or to an input of the distorting component at a first predefined switching rate; and
    switching either the received signal from the normal receive path or an output of the distorting component to an input of the at least one sampling means at a second predefined switching rate.

10. The method of claim 8, wherein the at least one sampling means includes a first sampling means configured to sample the received signal and a second sampling means configured to sample the distorted signal.

11. The method of claim 8, wherein distorting includes distorting the received signal such that higher frequencies are distorted to a greater extent of distortion than lower frequencies with the extent of distortion imposed in a monotonically increasing relationship to frequency.

12. The method of claim 8, wherein distorting includes distorting the received signal such that lower frequencies are distorted to a greater extent of distortion than higher frequencies.

13. The method of claim 8, wherein distorting includes distorting the received signal such that a first previously identified frequency band is distorted to a greater extent of distortion than a second previously identified frequency band.

14. The method of claim 13, wherein the extent of distortion is imposed on the first frequency band and the second frequency band in a non-monotonic fashion.

15. The method of claim 14, wherein distorting includes distorting signals within the first frequency band to a first approximately constant extent of distortion and to distort signals within the second frequency band to a second approximately constant extent of distortion, wherein the first extent of distortion and the second extent of distortion are not the same.

* * * * *